United States Patent [19]
Levine et al.

[11] Patent Number: 5,966,622
[45] Date of Patent: Oct. 12, 1999

[54] PROCESS FOR BONDING CRYSTALLINE SUBSTRATES WITH DIFFERENT CRYSTAL LATTICES

[75] Inventors: Barry Franklin Levine, Livingston; Christopher James Pinzone, Basking Ridge, both of N.J.

[73] Assignee: Lucent Technologies Inc., Murray Hill, N.J.

[21] Appl. No.: 08/947,175

[22] Filed: Oct. 8, 1997

[51] Int. Cl.[6] .................................................. H01L 21/762
[52] U.S. Cl. ........................... 438/459; 438/977; 156/247
[58] Field of Search ...................... 438/459, 406, 438/977, FOR 485, FOR 107; 148/DIG. 12; 156/247

[56] References Cited

U.S. PATENT DOCUMENTS

| | | |
|---|---|---|
| 4,891,329 | 1/1990 | Reisman et al. . |
| 5,346,848 | 9/1994 | Grupen-Sheansky et al. . |
| 5,391,257 | 2/1995 | Sullivan et al. . |

FOREIGN PATENT DOCUMENTS

| | | |
|---|---|---|
| 05275332 | 10/1993 | Japan . |
| 07307259 | 11/1995 | Japan . |

OTHER PUBLICATIONS

Chan, W. K. et al., "Van der Waals Bonded III–V Films for Optoelectronics", Extended Abstracts of the Fall Meeting of the Electrochemical Society, vol. 91–2, p. 689, Oct. 1991.
Goetz, G.G., "Generalized Reaction Bonding", Extended Abstracts of the Fall Meeting of the Electrochemical Society, vol.91–2, p. 679, Oct. 1991.

"Silicon Heterointerface Photodetector," by Hawkins, A. R. et al., *Apple. Phys. Lett.*, 68 (26) pp. 3692–3694 (Jun. 24, 1996).

"Physics and Applications of $Ge_x Si_{1-x}$ /Si Strained–Layer Heterostructure", by People, R., *IEEE Journal of Quantum Electronics*, vol. QE–22 No. 9, pp. 1696–1710 (Sep.1996).

Lammasniemi et al., *Institute of Electrical and Electronics Engineers*, "Bonding of Indium Phosphide Layers on Silicon Substrate", pp. 361–364, Apr. 19, 1993.

Hawkins et al., *Applied Physics Letters*, "Silicon Heterointerface Photodetector", vol. 68, No. 26, pp. 3692–3694, Jun. 24, 1996.

Totoki et al., *Japanese Journal of Applied Physics*, "Direct Bonding Between InP and $Gd_3Ga_5O_{12}$ for integrating Semiconductor and Magnetooptic Devices", vol. 34, No. 2A, pp. 510–514, Feb. 1, 1995.

Hawkins et al., *Applied Physics Letters*, "High Gain–Bandwidth–Product Silcon Heterointerface Photodetector", vol. 70, No. 3 pp. 303–305, Jan. 20, 1997.

*Primary Examiner*—George Fourson
*Attorney, Agent, or Firm*—Richard J. Botos

[57] ABSTRACT

A process for device fabrication is disclosed in which two substrates having different crystal lattices are bound together. In the process a layer of material that has a crystal lattice similar to the crystal lattices of the first substrate is formed on the surface of the second substrate. The thickness of the layer is about 1 nm to about 2 nm. The layer of material is then bound to the surface of the first substrate.

14 Claims, 1 Drawing Sheet

PROCESS FOR BONDING CRYSTALLINE SUBSTRATES WITH DIFFERENT CRYSTAL LATTICES

BACKGROUND OF THE INVENTION

1. Technical Field

The present invention is directed to processes for device fabrication, and, more particularly, photodetector devices, in which two crystalline substrates with different crystal lattices are bound together.

2. Art Background

Processes for fabricating certain semiconductor devices require that two wafers, each having a crystal lattice that is different from the other, be bound together. For example crystalline III–V substrates (e.g. Indium Gallium Arsenide substrates (InGaAs)) are bound to crystalline silicon substrates to fabricate p-i-n photodetectors. Such devices are described in Hawkins, A., et al., "Silicon heterointerface photodetector," *Appl. Phys. Lett.*, Vol. 68:26, pp. 3692–3694 (1996) (Hawkins et al. hereinafter). As used herein, III–V substrates are semiconductor compounds in which one of the elements is from column III of the Mendeleef Periodic Table and one of the elements is from column V of that Table.

Hawkins et al. describe a process for fabricating avalanche photodetector devices in which a silicon wafer is fused directly to an InGaAs surface of an indium phosphide (InP) substrate. In the Hawkins et al. process, an InGaAs surface is grown on the InP substrate by metalorganic chemical vapor deposition (MOCVD). The bonding surface of the silicon wafer is an epitaxial silicon layer grown on an $n^+$ substrate with a shallow p-type implant at the surface. After bonding, the InP substrate is subsequently removed leaving only the InGaAs layer bound to the silicon substrate. The bonding is performed by pressing the surfaces of the two substrates together for 20 minutes at 650° C. in an $H_2$ atmosphere.

The epitaxial layers of the resulting device 10 are illustrated in FIG. 1. Starting from the topmost epitaxial layer, there is a $p^+$-doped InGaAs layer 20, which is used for ohmic contact. Underlying layer 20 is the intrinsic InGaAs layer 25 which is used for photon absorption. Layer 25 is fused to layer 30, which was a n-type silicon implanted with boron. Layer 30 functions as a multiplication region for the detector.

After the above described structure is formed, the epitaxial layers 20 and 25 are etched to form isolated devices. To isolate the devices, a patterned metal layer 60 of Au/Zn is formed over layer 20 and the portions of layers 20 and 25 are not covered by the mask are etched away. Layer 60 is a top p-type contact. After etching, a dielectric layer 70 is formed on the sidewalls of the remaining portions of layers 20 and 25. An n-type metal contact layer 80 is formed on the exposed portion 85 of the silicon substrate 30.

Hawkins et al. states that the device described therein shows potential for high speed, high gain operation, etc. However, the quality of the devices depends on, among other things, the quality of the silicon-InGaAs interface. Accordingly, a process for forming a high quality interface between the two different surfaces is desired.

SUMMARY OF THE INVENTION

The present invention is directed to a process for bonding two wafers together each wafer having a crystal lattice structure that is different from the other. The invention is further directed to a process for device fabrication in which a first substrate with a first crystal structure is bound to a second substrate with a second crystal lattice structure. In the context of the present invention, a difference in lattice constant greater than about 0.1 percent qualifies as a different crystal lattice.

In the process of the present invention, an epitaxial layer of material having a crystal lattice that corresponds to the second crystal lattice structure is grown on a first surface of the first substrate. The first surface of the first substrate is then bound to the second substrate. Alternately, an epitaxial layer of material that corresponds to the first crystal structure is grown on a first surface of the second substrate. The first surface of the second substrate is then bound to the first substrate with the first crystal structure.

The thickness of the epitaxial layer is about 1 nm to about 2 nm. The epitaxial layer is grown on the substrate by a conventional technique such as MOCVD. The purpose of the epitaxial layer is to reduce the lattice mismatch between the first substrate and the second substrate at the bonding interface. It is advantageous if the material selected for the epitaxial layer is the same material as the surface of the substrate to which the epitaxial layer is bound.

For example, in the context of the photodetector devices previously described, it is desired to bond a silicon substrate to a III–V substrate such as InGaAs device layers formed on an InP substrate. In this embodiment either an epitaxial layer of InGaAs is grown on the silicon substrate or an epitaxial layer of silicon is grown on the top InGaAs layer of the InP substrate. In either embodiment, the thickness of the epitaxial layer is about 1 nm to about 2 nm.

After the epitaxial layer is grown on either the first or second substrate, the two substrates are bound together. Conventional techniques are contemplated as suitable (e.g., pressing the two surfaces together and subjecting the wafers to high temperatures in a non-oxygen-containing atmosphere (e.g. $H_2$)). If the resulting bound structure is to be formed together into a photodetector device, the bulk of either the first substrate or the second substrate is etched away either before or after the substrates are bound together. Only one or more discrete layers formed on the removed substrate remain bound to the other substrate.

It is advantageous if the substrates, once bound together, but before the bulk of one of the substrates is etched away, are not subjected to large variations (i.e., variations less than 100° C.) in temperature. Such large temperature variations are to be avoided because the mismatch in the coefficient of thermal expansion between the first substrate and the second substrate causes the two substrates, when bound together, to expand or contract by significantly different amounts in response to temperature variations. Thus, when the bound substrates are subjected to large variations in temperature, the different amounts of expansion will introduce strains into the substrates which, in turn, can cause the substrates to crack.

In the process of the present invention, such strains are prevented by removing the bulk of the III–V substrate, leaving only the layers formed thereon, either before the substrates are bonded together or before the bonded substrates are cooled. For example, in the case of an InP substrate on which InGaAs layers are formed, the InP substrate is etched away, leaving only the device layers (the InGaAs layers in this example). In order to ensure that the desired InGaAs or InP layer(s) remain, an etch stop layer is formed on the InP substrate. Examples of suitable etch stop layers are InAlAs and InGaAs.

DETAILED DESCRIPTION

As previously described, the invention is directed to a process for bonding two crystal substrates, each having a crystal lattice constant different from the other, together. One problem associated with bonding two such substrates together are the strains introduced into the substrates in the regions adjacent to the bond that arise from the lattice mismatch between the two substrates. Also, due to the lattice mismatch, not all of the atoms on the bonded surface of the first substrate match up with the atoms on the bonded surface of the second substrate. These unmatched atoms are referred to as "dangling bonds." These dangling bonds create interface states, defects, and traps. The presence of these interface states, defects, and traps adversely affects device performance.

In the present invention, prior to bonding the first substrate to the second substrate, a layer of material is grown on one of either the first or second substrates that has a crystal lattice that more closely matches the crystal lattice of the other substrate. In order to control the defects that occur in the grown layer due to the lattice mismatch between it and the substrate on which it is grown, the thickness of grown layer is kept within the range of about 1 nm to about 2 nm.

Crystal substrates with different crystal lattices are bound together to form a variety of devices, one example of which is an avalanche photodetector device. In the avalanche photodetector device, there is a III–V substrate for the absorption of light and the generation of carriers. The carriers are multiplied in the silicon substrate, which results in the amplification of the electrical signal generated by the device. For convenience herein, the first substrate is referred to as the silicon substrate and the second substrate is referred to as the III–V substrate. However, since the invention is directed to bonding two surface with different crystal lattices, the invention is not limited to these specific materials.

Figure 1:
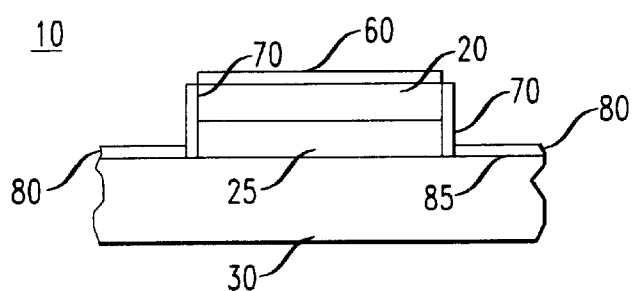
FIG. 1. illustrates a conventional structure for photodetector devices.
Figure 2:
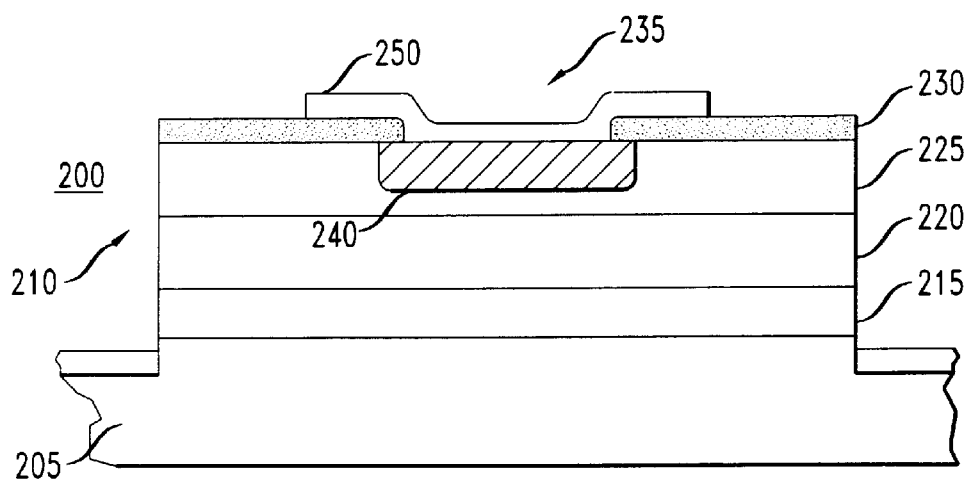
FIG. 2 is a schematic side view of a device formed by the present invention.

One example of an avalanche detector is illustrated in FIG. 2. The device 200 illustrated in FIG. 2 is formed on an n$^+$ silicon substrate 205. A patterned stack of materials 210 forms the device 200. The patterned stack is layer of n$^-$ silicon 215 on which is formed a layer of n$^-$ InGaAs 220, a layer of InP 225, a layer of silicon dioxide (SiO$_2$) 230, and a layer of p-type metal 250 (e.g. gold-beryllium alloy). A window 235 was formed in the SiO$_2$ layer 230 in stack 210 and zinc was diffused therein to form the p-n junction 240. The n-contact 250 is aluminum. Other structures for avalanche detectors are well known to one skilled in the art.

The above-described device is prepared by forming one or more InGaAs and InP layers on an InP substrate. The one or more InGaAs and InP (or other suitable III–V materials) layers are referred to as device layers. Before the InGaAs layers are formed on the InP substrate an etch stop layer is formed thereon to assist in etching the InP substrate away later on. Suitable materials for such an etch stop are well known to one skilled in the art. Examples of suitable etch stop materials include InGaAs.

The InGaAs or InP layers are grown on the InP substrate using conventional CVD techniques. Typically the InGaAs or InP layers have a thickness of about 0.05 $\mu$m to about 5 $\mu$m. After the InGaAs layers are formed on the substrate, the substrate is maintained at a temperature below 500° C. to avoid depleting arsenic from the InGaAs. In this regard, it is advantageous if the silicon is grown on the InGaAs layer because the growth of silicon by molecular beam epitaxy (MBE) is accomplished at temperatures below 500° C. and also removes arsenic oxide and elemental arsenic that form on the InGaAs surface. Before deposition the InGaAs surface is cleaned to remove impurities. First the InGaAs layer is cleaned in a solution suitable for removing any residual photoresist or other organics thereon. The surface is etched, for example, in an aqueous solution of phosphoric acid and peroxide (e.g., H$_3$PO$_4$:H$_2$O$_2$:H$_2$O=1:1:38 parts by volume) followed by aqueous hydrofluoric acid. Other conventional wet etch expedients are contemplated as suitable. After cleaning, the InGaAs surface is kept in an essentially oxygen-free environment.

The InP/InGaAs substrate is then placed in a silicon MBE chamber and a layer of silicon having a thickness in the range of about 1 nm to 2 nm is grown on the InGaAs surface. While maintaining the Si-coated substrate in an essentially oxygen-free environment, the substrate is transferred to the apparatus in which it is to be bound to the silicon substrate. Both the Sicoated substrate and the silicon substrate are placed in a holder which presses them together. While being held under pressure, the substrates are heated to a temperature in the range of about 450° C. to about 700° C. in an H$_2$ atmosphere. After about 20 minutes, the substrates are bound together. The wafers are then cooled and the bonded substrate is subsequently processed to form the avalanche photodetector using conventional techniques (i.e., etching, deposition of additional device layers, deposition of metal contacts, patterning of the layers to form individual devices etc.).

In certain embodiments, it is advantageous to pattern one of the two surfaces prior to bonding. The pattern provides an irregular surface that allows gas to escape when the surfaces are pressed together. One example of a suitable pattern is a series of lines and spaces wherein the width of the lines is about 1 gm to about 50 gm and the depth of the pattern into the substrate is in the range of about 0.1 $\mu$m to about 1 $\mu$m. If the patterned surface is the surface on which the thin layer is grown, the surface is patterned either before or after the thin layer is formed thereon.

As previously stated, when the first substrate and the second substrate are bound together, it is not desirable to subject the bound substrates to large temperature variations because of the mismatch in the coefficients of thermal expansion between the two substrates. Therefore, it is advantageous if the bulk of one of the substrates is removed before the bound structure is subjected to a large variation in temperature. In this regard, it is contemplated that the bulk of one substrate is removed either before or after the surface of the two substrates are joined together. In the embodiment of the present invention wherein the device is an avalanche photodetector, the bulk of the III–V substrate is removed because the device layers are typically formed on the III–V substrate, and it is the bulk of the substrate on which the device layers are formed that does not become part of the device.

Figure 3:
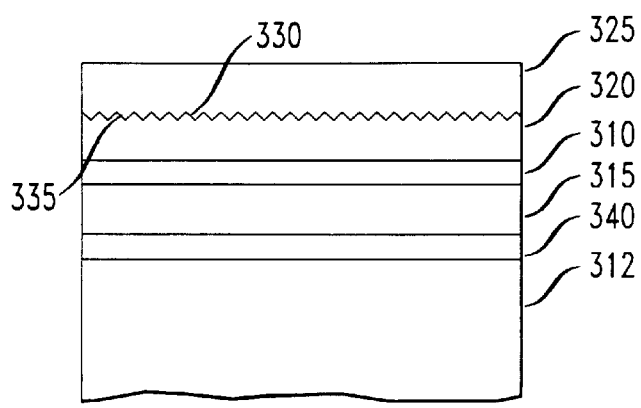
FIG. 3 is a schematic side view of an intermediate structure formed in one embodiment of the process of the present invention.

Although it is desirable to etch the bulk of the III–V (e.g., InP) substrate away from the device (e.g.InGaAs) layers before the device layers are bound to the silicon substrate, the subsequent handling of the very thin device layers poses a practical problem. In one embodiment of the present invention, this problem is addressed by bonding a handling substrate to the device layers and then etching the bulk of the III–V substrate away from the bonded assembly of device layers and handling substrate. The device layers are then bound to the other substrate (e.g., the silicon substrate), after which the handle is removed. This embodiment is described with reference to FIG. 3. Because the handling substrate and the other substrate are bound together and subsequently cooled, it is advantageous if the handling substrate and the substrate to which it is bound have the same or similar coefficients of thermal expansion.

For example, in this embodiment a diffusion barrier layer 310 is formed over the device layer(s) 315 (e.g. the InGaAs layers formed on the InP substrate) of a III–V substrate 312. Examples of materials suitable for use as diffusion barrier layers are metals such as titanium. A suitable thickness for the diffusion barrier layer is readily ascertained by those skilled in the art. Suitable thicknesses are in the range of about 2 nm to about 100 nm. A layer of gold 320 is formed over the diffusion barrier layer 310. Gold is selected because of its malleability and because it is compatible with current technology for making photodetector devices. Other metals which also meet these criteria are contemplated as suitable. The gold layer 320 has a thickness of about 0.25 $\mu$m to about 3 $\mu$m. A silicon substrate 325 is then pressed against the gold layer 320 at room temperature. (In an alternative embodiment not depicted in FIG. 3, a gold layer is deposited on the silicon substrate also and the two gold layers are pressed then pressed together.) About 30 kg/mm$^2$ of force is determined adequate to cause the silicon substrate 325 to adhere to the gold layer 320. In order to improve adhesion, the surface 330 of the silicon substrate 325 placed in contact with the gold layer can be patterned with grooves 335 or some other configuration, that permits some portions of the surface 330 to penetrate further into the gold layer 320 than other portions of the silicon surface 330. However, patterning of the silicon substrate is not required to obtain adequate adhesion between the silicon and the gold. The bulk of the III–V substrate 312 is then etched away. An etch stop layer 340, interposed between the bulk of the III–V substrate 312 and the device layer(s) 315 formed thereon, prevents the etchant from removing the device layers 312.

After this structure is formed, it is bound to the silicon substrate as previously described. For example, a layer of silicon having a thickness of about 1 nm to about 2 nm is grown onto the surface of the device layer. The silicon surface is then bound to a silicon substrate. The silicon handle is then removed by dipping the handle in a silicon etchant solution or other conventional expedient for etching silicon. The gold layer and any etch stop layer are also removed.

Other methods for removing the substrate before the device layers are bound to the silicon substrate utilize Van der Waals' force to hold the bonding surfaces together. The surfaces (e.g., the InGaAs device layer and the thin InGaAs layer formed on the silicon substrate) that are to be bound together are cleaned and placed in physical contact. The surfaces are held together by Van der Waals' force. The bulk of the III–V substrate is then removed by etching. Either dry etching or wet etching expedients are contemplated as suitable. One example of a suitable dry etch expedient is reactive ion etching (RIE). If RIE is used, the III–V substrate has an etch stop layer formed thereon (e.g. InGaAs or InAlAs) which prevents the etch from progressing to the device layers. An example of a suitable wet etch expedient is a spray of aqueous HCl. One examples of a suitable wet etch stop layer is InGaAs.

What is claimed is:

1. A process for fabricating a device comprising:

selecting a first, single crystal substrate having a first crystal lattice and a second single crystal substrate having a second crystal lattice different from the first crystal lattice wherein the second substrate comprises a bulk substrate that has at least one single crystal device layer formed thereover;

forming a layer of material on one of the first substrate or the single crystal device layer of the second substrate that has the crystal lattice of the other of the first substrate or the single crystal device layer of the second substrate, wherein the layer of material has a thickness of about 1 nm to about 2 nm;

bonding the layer of material to the other of the first substrate or the single crystal device layer of the second substrate; and removing bulk of the second substrate, leaving the device layer bonded to the first single crystal substrate.

2. The process of claim 1 wherein the first, single crystal substrate is a silicon substrate and the second, single crystal substrate is a III–V single crystal substrate with at least one III–V device layer formed thereover.

3. The process of claim 2 wherein the III–V substrate is an indium phosphide substrate and the at least one III–V device layer is selected from the group consisting of indium gallium arsenide and indium phosphide.

4. The process of claim 2 wherein the layer of material is a layer of III–V material.

5. The process of claim 4 wherein the layer of III–V material is grown eptiaxially on the silicon substrate.

6. The process of claim 1 wherein the layer of material is bound to the other of the first substrate or the single crystal device layer of the second substrate by pressing the layer of material to the surface of the other of the first substrate or the single crystal device layer of the second substrate that has a crystal lattice that matches the crystal lattice of the layer of material.

7. The process of claim 6 wherein the layer of material is pressed to the surface of the other of the first substrate or the single crystal device layer of the second substrate at a temperature in the range of about 450° C. to about 700° C. in a substantially non-oxygen containing atmosphere.

8. The process of claim 1 wherein the bulk of the second substrate is removed from the at least one device layer before the at least one device layer is bound to the first substrate.

9. The process of claim 1 wherein an etch stop layer is formed on the bulk of the second substrate and the at least one device layer is formed over the etch stop layer.

10. The process of claim 9 wherein the etch stop layer is selected from the group consisting of a layer of indium gallium arsenide and a layer of indium aluminum arsenide.

11. The process of claim 8 further comprising:

forming a diffusion barrier layer over the at least one device layer;

forming a layer of gold over the diffusion barrier layer; and bonding a silicon substrate to the gold layer before removing the bulk of the second substrate from the at least one single crystalline device layer of the second substrate after which the layer of material is formed on either the first substrate or the at least one single crystalline device layer and the first substrate is bonded to the at least one device layer.

12. The process of claim 11 wherein the surface of the silicon substrate that is bound to the gold layer has a non-planar configuration.

13. The process of claim 6 wherein the two surfaces are pressed together with a force sufficient for the surfaces to be held together by Van der Waals' forces and the bulk of the second substrate is removed by etching.

14. The process of claim 13 wherein the first, single crystal substrate is a silicon substrate and the second, single crystal substrate is a III–V single crystal substrate with at least two III–V layers formed thereon, one of which stops the etch of the III–V substrate from proceeding to the second III–V layer.

* * * * *